(12) United States Patent
Hardee et al.

(10) Patent No.: US 6,414,897 B1
(45) Date of Patent: Jul. 2, 2002

(54) LOCAL WRITE DRIVER CIRCUIT FOR AN INTEGRATED CIRCUIT DEVICE INCORPORATING EMBEDDED DYNAMIC RANDOM ACCESS MEMORY (DRAM)

(75) Inventors: Kim Carver Hardee; Michael Parris, both of Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 1 day.

(21) Appl. No.: 09/651,939

(22) Filed: Aug. 31, 2000

(51) Int. Cl.[7] .................................................. G11C 8/00
(52) U.S. Cl. .................. 365/230.06; 365/190
(58) Field of Search ....................... 365/230.08, 230.06, 365/233, 205, 189.05, 190, 189.06

(56) References Cited

U.S. PATENT DOCUMENTS 5,982,692 A * 11/1999 Lattimore et al. .......... 365/208
6,005,799 A * 12/1999 Rao ............................ 365/165
6,141,237 A * 10/2000 Eliason et al. .............. 365/145

\* cited by examiner

*Primary Examiner*—Michael S. Lebentritt
*Assistant Examiner*—Hien Nguyen
(74) *Attorney, Agent, or Firm*—William J. Kubida; Peter J. Meza; Hogan & Hartson LLP

(57) ABSTRACT

A local write driver circuit for an integrated circuit device memory array which requires only a single write enable signal to couple complimentary data signals between global and local write data lines thereby obviating the need to provide complementary write enable signals as in conventional implementations. By eliminating the need for a second complementary write enable signal line, less on-chip die area is required for the signal path along with a concomitant reduction in power requirements due to the fact that there is one less line which has to switch during a given write cycle.

11 Claims, 4 Drawing Sheets

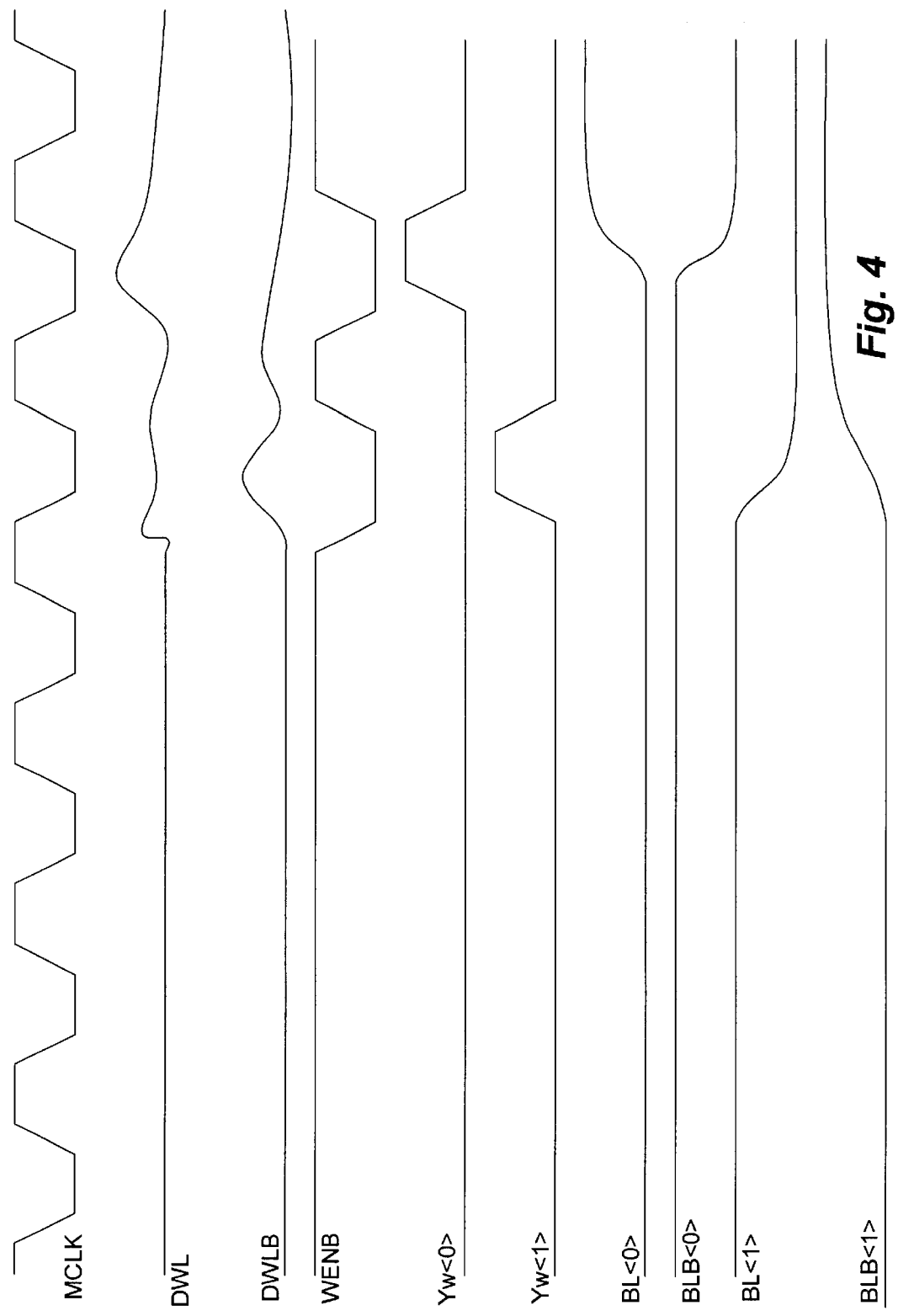

LOCAL WRITE DRIVER CIRCUIT FOR AN INTEGRATED CIRCUIT DEVICE INCORPORATING EMBEDDED DYNAMIC RANDOM ACCESS MEMORY (DRAM)

BACKGROUND OF THE INVENTION

The present invention relates, in general, to the field of integrated circuit memory devices. More particularly, the present invention relates to a local write driver circuit for an integrated circuit device incorporating embedded dynamic random access memory ("DRAM").

Integrated circuit memory devices and those including embedded DRAM often use a local driver circuit to couple complementary data signals on a pair of global write data lines to a corresponding pair of local write data lines. Such conventional local drivers have utilized complementary metal oxide semiconductor ("CMOS") pass (or transmission) gates comprising parallel coupled P-channel and N-channel transistors. These pass gates require activation by complementary write enable signals (WEN and WENB), with the former being used to activate the N-channel device while the WENB signal is used to activate the P-channel devices.

SUMMARY OF THE INVENTION

Disclosed herein is a local write driver circuit for an integrated circuit device memory array which requires only a single write enable signal in order to couple complementary data signals between global and local write data lines thereby obviating the need to provide complementary write enable signals as in conventional implementations. By eliminating the need for a second complementary write enable signal line, less on-chip die area is required for the signal path along with a concomitant reduction in power requirements due to the fact that there is one less line which has to switch during a given write cycle.

Particularly disclosed herein is a local driver circuit for an integrated circuit memory array including complementary global write data lines and local write data lines. The driver circuit comprises a single write enable signal line for selectively coupling a data signal on a first one of the global write data lines to a first of the local write data lines and a complement to the data signal on a second of the global write data lines to a second of the local write data lines.

Also particularly disclosed herein is an integrated circuit device including a driver circuit for a memory array including complementary global write data lines and local write data lines. The driver circuit comprises first and second switching devices having a first terminal thereof respectively coupled to one of the complementary global write data lines and a control terminal thereof coupled to a write enable signal line. Third and fourth series connected switching devices are coupled between a supply voltage line and a reference voltage line, the third and fourth switching devices being coupled to one of the complementary local write data lines and the third and fourth switching devices including a control terminal thereof. Fifth and sixth series connected switching devices are also coupled between the supply voltage line and the reference voltage line, the fifth and sixth switching devices being coupled to another one of the complementary local write data lines and the fifth and sixth switching devices including a control terminal thereof. The control terminals of the third and sixth switching devices are coupled to a second terminal of the first switching device and the control terminals of the fourth and fifth switching devices are coupled to a second terminal of the second switching device. A seventh switching device is coupled between the complementary local write data lines and has a control terminal thereof coupled to the write enable signal line. Eighth and ninth switching devices couple the second terminal of the first switching device to the reference voltage line. The eighth switching device has a control terminal coupled to the second terminal of the second switching device and the ninth switching device has a control terminal coupled to the write enable signal line. Tenth and eleventh switching devices couple the second terminal of the second switching device to the reference voltage line. The tenth switching device has a control terminal coupled to the second terminal of the first switching device and the eleventh switching device has a control terminal coupled to the write enable signal line.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 4 is a plot of the DWL and DWLB signals on the complementary local write data lines, WENB and other related signals for the specific embodiment of the present invention shown in the functional block diagram of FIG. 3.

DESCRIPTION OF A PREFERRED EMBODIMENT

Figure 1:
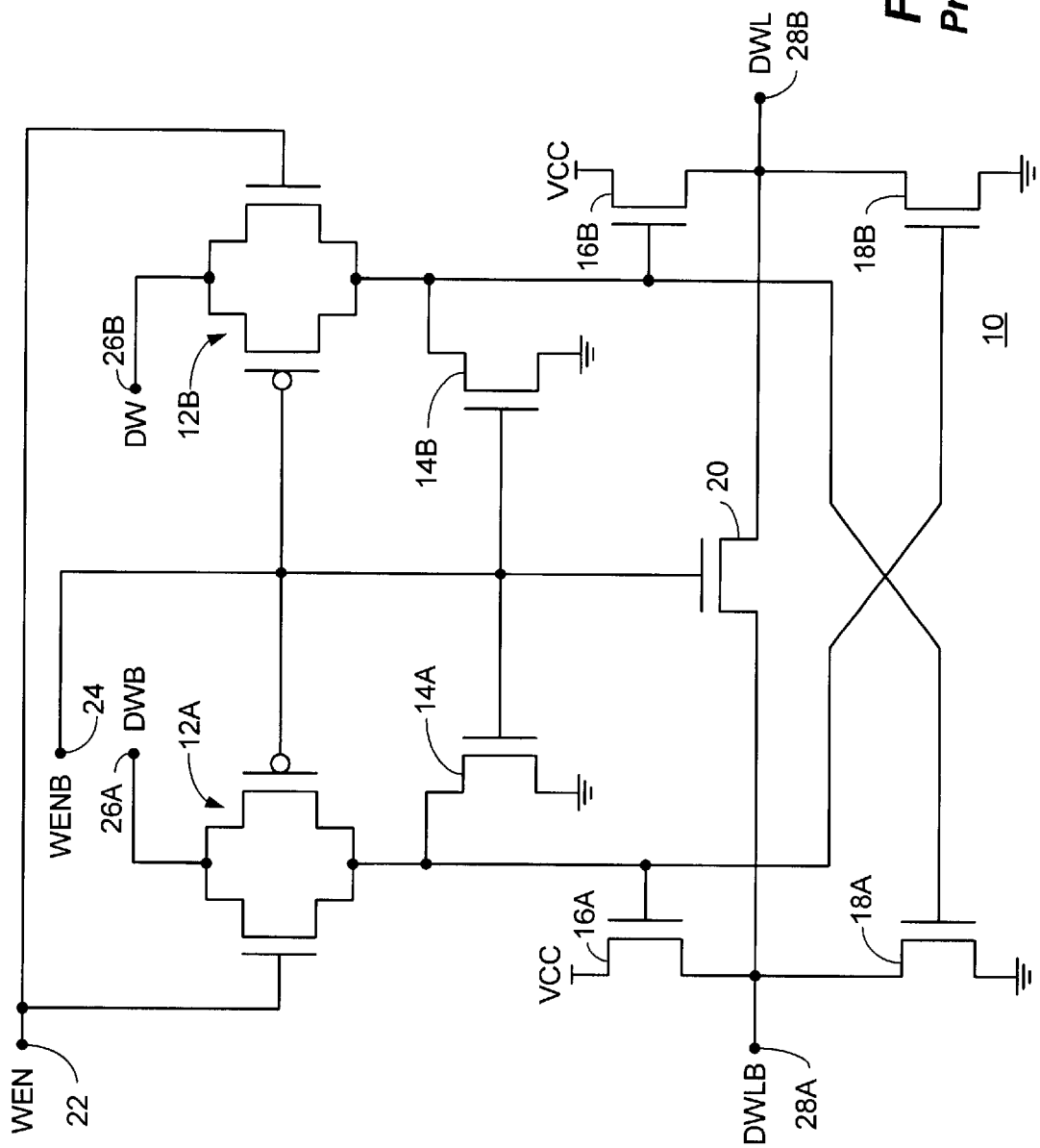
FIG. 1 is a detailed schematic illustration of a conventional local write driver circuit for an integrated circuit device incorporating embedded DRAM showing the use of a pair of CMOS pass gates connected to the global write data lines and which requires an additional write enable ("WEN") control signal.

With reference now to FIG. 1, a detailed schematic illustration of a conventional local write driver circuit 10 for an integrated circuit device incorporating embedded DRAM is shown. The conventional circuit 10 incorporates a pair of CMOS pass gates 12A and 12B, each of which requires an additional write enable ("WEN") control signal as will be more fully described hereinafter.

The pass (or transmission) gates 12A and 12B comprise parallel coupled N-channel and P-channel MOS transistors as shown. The output of the pass gate 12A is coupled to one terminal of N-channel transistor 14A, which has its other terminal coupled to circuit ground, as well as to the gate terminal of N-channel transistors 16A and 18B. Similarly, output of the pass gate 12B is coupled to one terminal of N-channel transistor 14B, which has its other terminal coupled to circuit ground, as well as to the gate terminal of N-channel transistors 16B and 18A. N-channel transistors 16A and 18A are coupled in series between a supply voltage source ("VCC") and circuit ground as are N-channel transistors 16B and 18B. The node intermediate N-transistors 16A and 18A is coupled to one terminal of N-channel transistor 20 which has its other terminal coupled to the node intermediate N-channel transistors 16B and 18B.

A write enable ("WEN") is supplied to line 22 which is coupled to the gate terminal of the N-channel transistors of the pass gates 12A and 12B. The complementary write enable bar ("WENB") signal is then supplied to the gate terminal of the P-channel transistors of the pass gates 12A and 12B as well as to the gate terminals of N-channel transistors 14A, 14B and 20. The node intermediate N-channel transistors 16A and 18A is coupled to local write data line bar ("DWLB") line 28A while the node intermediate N-channel transistors 16B and 18B is coupled to the complementary local write data ("DWL") line 28B.

In a specific application of the driver circuit 10, the local write data lines 28B, 28A may be connected to multiple sense amplifiers (e.g. eight on left and eight on right). Column select pass gates connect the local write data lines 28B, 28A to the sense amplifier latch nodes (or bit lines). Write enable control signals WEN and WENB on lines 22 and 24 respectively, turn the local write driver circuit 10 "on" and "off". When the local write driver circuit 10 is turned "off" (i.e. signals WEN "low" and WENB "high") the local write data lines 28B, 28A are floating. When the local write driver circuit 10 is turned "on" (i.e. signals WEN "high" and WENB "low") the local write data lines 28B, 28A are driven either "high" or "low" depending on the level of the global write data lines. If both the global write data lines 26B, 26A are "low" then the local write data lines 28B, 28A are floated (i.e. no write operation).

Figure 2:
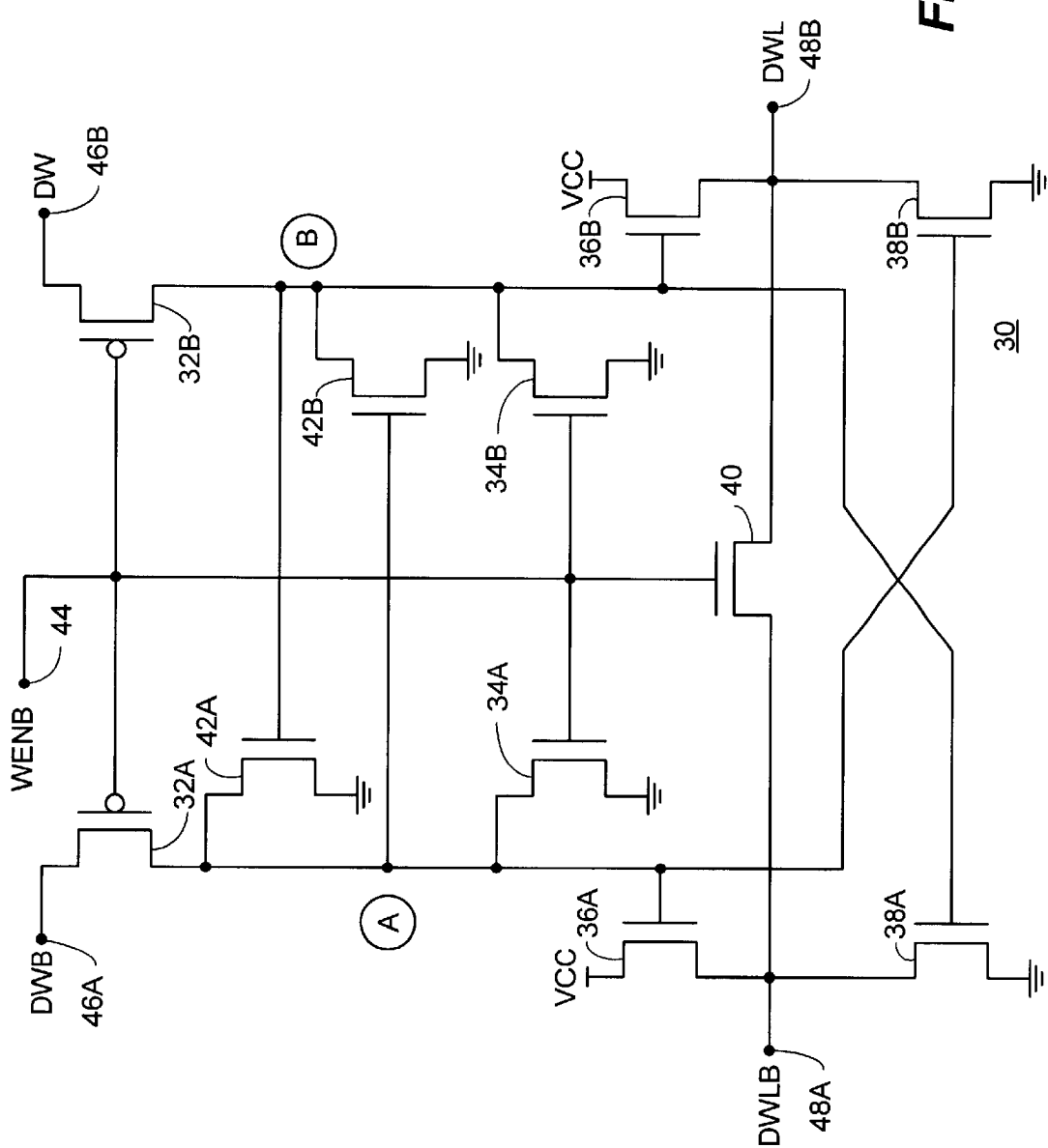
FIG. 2 is a detailed schematic illustration of a local write driver circuit in accordance with an embodiment of the present invention in which the CMOS pass gates have been eliminated and in which the additional WEN control signal is not required resulting in a reduction in power requirements and on-chip die area.

With reference additionally now to FIG. 2, a detailed schematic illustration of a local write ("LWRITE") driver circuit 30 in accordance with an embodiment of the present invention is shown. The driver circuit 30 is designed such that the CMOS pass gates 12A and 12B of the conventional circuit 10 of FIG. 1 have been eliminated along with the requirement for the WEN control signal. This results in a significant reduction in power requirements due to the fact that there is one less line which has to switch during a given write cycle as well as a reduction in on-chip die area need to route the WEN control signal.

The driver circuit 30 comprises a P-channel transistor 32A coupled to one terminal of N-channel transistor 34A, which has its other terminal coupled to circuit ground, as well as to the gate terminal of N-channel transistors 36A and 38B. Similarly, P-channel transistor 32B is coupled to one terminal of N-channel transistor 34B, which has its other terminal coupled to circuit ground, as well as to the gate terminal of N-channel transistors 36B and 38A. N-channel transistors 36A and 38A are coupled in series between a supply voltage source ("VCC") and circuit ground as are N-channel transistors 36B and 38B. The node intermediate N-transistors 36A and 38A is coupled to one terminal of N-channel transistor 40 which has its other terminal coupled to the node intermediate N-channel transistors 36B and 38B.

The driver circuit 30 also comprises an N-channel transistor 42A coupled between gate terminal of N-channel transistor 36A and circuit ground, with its gate terminal coupled to the gate terminal of N-channel transistor 36B. In like manner, an N-channel transistor 42B is coupled between gate terminal of N-channel transistor 36B and circuit ground, with its gate terminal coupled to the gate terminal of N-channel transistor 36A. The complementary write enable bar ("WENB") signal on line 44 is then supplied to the gate terminal of the P-channel transistors 32A and 32B as well as to the gate terminals of N-channel transistors 34A, 34B and 40. The global write data lines 46A (DWB) and 46B (DW) are coupled to the other terminal of the P-channel transistors 32A and 32B respectively. The node intermediate N-channel transistors 36A and 38A is coupled to local write data line bar ("DWLB") line 48A while the node intermediate N-channel transistors 36B and 38B is coupled to the complementary local write data ("DWL") line 48B.

The driver circuit 30 uses P-channel transistors 32A, 32B to connect the global write data lines 46A, 46B to the driver transistors 36A, 36B, 38A, 38B. This eliminates the need for the WEN signal (line 22 FIG. 1) which reduces power requirements because there is one less line which has to switch during a given write cycle. Transistors 42A and 42B function to hold node (A) at a reference voltage level of VSS (circuit ground) if node (B) is "high" and to hold node (B) at VSS if node (A) is "high".

Figure 3:
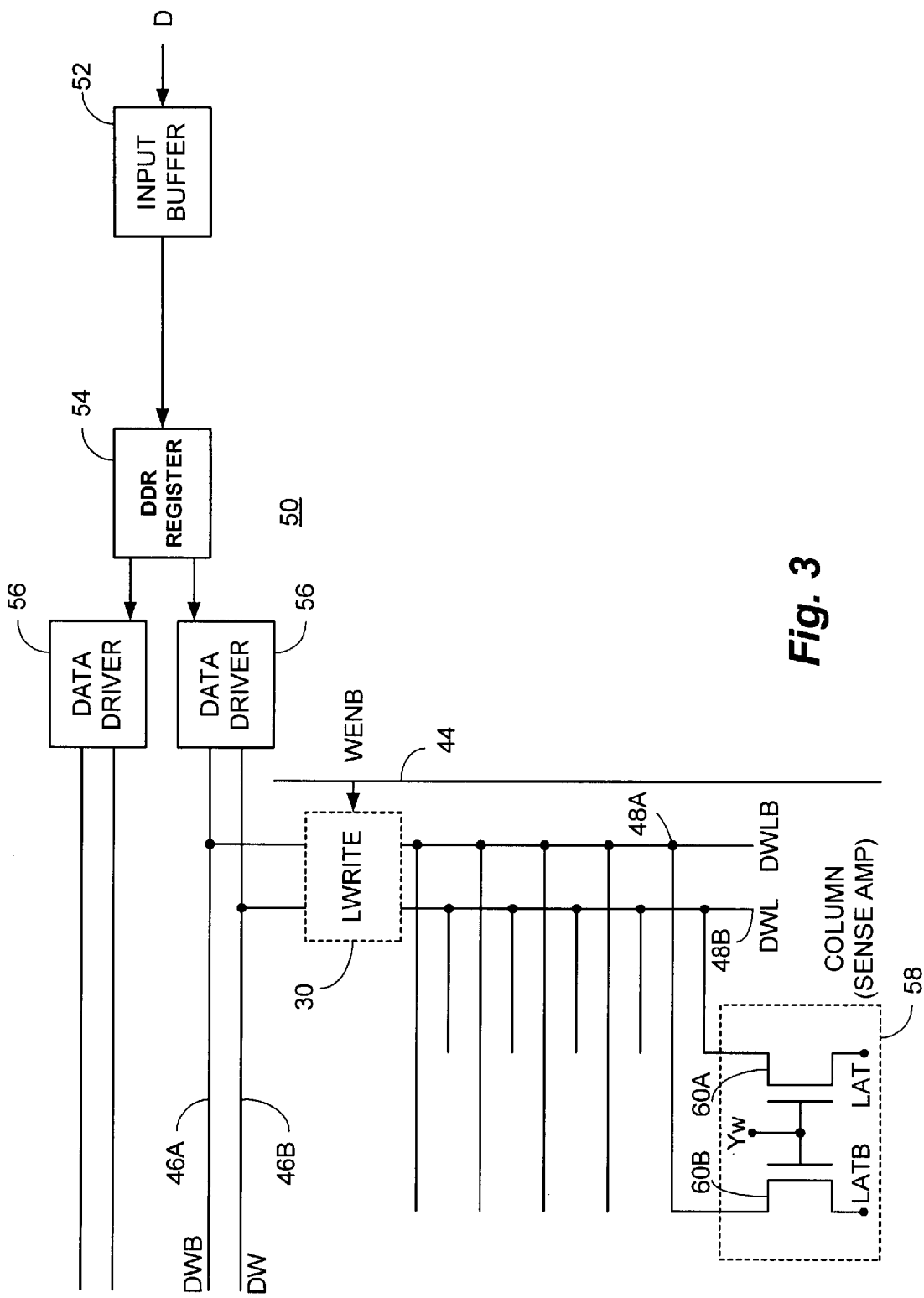
FIG. 3 is a functional block diagram of a representative write data path for an embedded DRAM portion of an integrated circuit device illustrating the local write driver circuit of FIG. 2 as coupled to the global write data lines ("DW", "DWB"), local write data lines ("DWL", "DWLB") and write enable bar ("WENB") signal line without the necessity of supplying the complementary write enable signal WEN.

With reference additionally now to FIG. 3, a functional block diagram of a representative write data path 50 for an embedded DRAM portion of an integrated circuit device is shown illustrating the local write driver circuit 30 ("LWRITE") of FIG. 2. The write data path 50 includes an input buffer 52 for receiving data input and passing the same to a double data rate ("DDR") register 54. Output from the DDR register 54 is supplied to a number of individual data drivers 56 which drive pairs of complementary global write data lines 46A, 46B.

The driver circuit 30 is coupled to the complementary global write data lines 46B, 46A ("DW", "DWB"), complementary local write data lines 28A, 28B ("DWL", "DWLB") and write enable bar ("WENB") signal line 44. The complementary local write data lines 28A, 28B are coupled to a number of column sense amplifiers 58. As shown, the write data path 50 does not require the provision of the complementary write enable signal WEN heretofore required by the conventional circuit 10 of FIG. 1.

The LAT and LATB signals are the latch nodes in the sense amplifier 58. These nodes are connected through pass transistors 60A, 60B respectively to the local write data lines 48B, 48A. This nodes are also coupled to bit lines BL and BLB. These pass transistors 60A, 60B are controlled by the write column select signal Yw. In a particular embodiment of the present invention, the local write data lines 48B, 48A may be shared by eight sense amplifiers 58, with each having a unique Yw signal.

The local write data lines 48B, 48A are driven by the LWRITE driver circuit 30 during a write operation. The LWRITE driver circuit 30 has the global write data lines 46B, 46A (DW and DWB) and the write enable bar signal on line 44 (WENB) as inputs. In operation, a write occurs to a selected sense amplifier 58 when the corresponding Yw signal is "high", the WENB signal on line 44 is "low" and one of the global write data lines 46B, 46A is "high".

In a specific implementation of the present invention, the global write data lines 46B, 46A may be formed in the third metal layer of the integrated circuit and run across one 2 MEG block. These lines are driven to either a full supply voltage ("VCC") or VSS levels during a write operation by the data drivers 56. The global write data lines 46B, 46A switch at the clock frequency at a single data rate 20 ("SDR"). The GDW lines may be formed in the fifth metal layer and run from the input buffer 52 in the 8 MEG register to each 2 MEG DDR register 54. These GDW lines switch at twice the clock frequency during a write operation. This is called "double data rate" ("DDR"). The DDR register 54 converts the GDW DDR signals to SDR DW and DWB signals on global write data lines 46B, 46A respectively. The input buffer 52 latches the DDR data in ("D") inputs. Since the GDW lines are DDR, there are one half the number of lines compared to if they were SDR. This makes it feasible to run these lines across the 2 MEG blocks with a large enough spacing to provide low capacitance and lower power.

With reference additionally now to FIG. 4, a plot of the DWL and DWLB signals on the complementary local write data lines, WENB and other related signals for the specific embodiment of the present invention shown in the functional block diagram of FIG. 3 are shown. These waveforms illustrate the timing for a write cycle when the signal WENB on line 44 is "low" and the write column select signal Yw is "high". The local write data lines 48B, 48A are driven by the LWRITE driver circuit 30 (FIG. 3) "high" or "low" based on the state of the global write data lines 46B, 46A (not shown). The LAT, LATB nodes (as also shown in FIG. 3) are driven to opposite states through the N-channel pass transistors 60A, 60B respectively. The bit lines BL, BLB follow the LAT, LATB nodes, through these pass transistors 60A, 60B.

While there have been described above the principles of the present invention in conjunction with specific circuitry, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including a driver circuit for a memory array including complementary global write data lines and local write data lines, said driver circuit comprising:

first and second switching devices having a first terminal thereof respectively coupled to one of said complementary global write data lines and a control terminal thereof coupled to a write enable signal line;

third and fourth series connected switching devices coupled between a supply voltage line and a reference voltage line, said third and fourth switching devices being coupled to one of said complementary local write data lines, said third and fourth switching devices including a control terminal thereof;

fifth and sixth series connected switching devices coupled between said supply voltage line and said reference voltage line, said fifth and sixth switching devices being coupled to another one of said complementary local write data lines, said fifth and sixth switching devices including a control terminal thereof, said control terminals of said third and sixth switching devices being coupled to a second terminal of said first switching device and said control terminals of said fourth and fifth switching devices being coupled to a second terminal of said second switching device;

a seventh switching device coupled between said complementary local write data lines, said seventh switching device having a control terminal thereof coupled to said write enable signal line;

eighth and ninth switching devices coupling said second terminal of said first switching device to said reference voltage line, said eighth switching device having a control terminal coupled to said second terminal of said second switching device and said ninth switching device having a control terminal coupled to said write enable signal line; and tenth and eleventh switching devices coupling said second terminal of said second switching device to said reference voltage line, said tenth switching device having a control terminal coupled to said second terminal of said first switching device and said eleventh switching device having a control terminal coupled to said write enable signal line.

2. The integrated circuit of claim 1 wherein said first through eleventh switching devices comprise MOS transistors.

3. The integrated circuit of claim 2 wherein said first and second switching devices comprise P-channel transistors.

4. The integrated circuit of claim 2 wherein said third through eleventh switching devices comprise N-channel transistors.

5. The integrated circuit of claim 1 wherein said write enable signal line is an active low signal line.

6. An integrated circuit device including a local driver circuit comprising:

first and second differential input signals;

a differential driver circuit comprising a plurality of MOS transistors of a first conductivity type;

first and second MOS pass transistors of a second conductivity type coupling said first and second differential input signals to said differential driver circuit; and a control signal line coupled to a control terminal of said first and second MOS pass transistors.

7. The integrated circuit device of claim 6 wherein said differential driver circuit comprises cross-coupled pairs of N-channel MOS transistors.

8. The integrated circuit device of claim 6 wherein said first and second MOS pass transistors comprise P-channel MOS transistors each having a first terminal thereof coupled to receive said first and second differential input signals respectively and a second terminal thereof coupled to said differential driver circuit.

9. The integrated circuit device of claim 8 further comprising:

third and fourth MOS transistors coupling said second terminal of said first and second MOS pass transistors respectively to a reference voltage line, said third and fourth MOS transistors having a control terminal thereof coupled to said second terminal of said second and first MOS pass transistors respectively.

10. The integrated circuit device of claim 6 wherein said first and second differential input signals comprise complementary data write signals.

11. The integrated circuit device of claim 10 wherein said control signal line is a write enable signal line.

* * * * *

UNITED STATES PATENT AND TRADEMARK OFFICE
CERTIFICATE OF CORRECTION

PATENT NO. : 6,414,897 B1
DATED : July 2, 2002
INVENTOR(S) : Kim Carver Hardee and Michael Parris It is certified that error appears in the above-identified patent and that said Letters Patent is hereby corrected as shown below:

<u>Title page,</u>
Item [57], ABSTRACT,
Line 3, "complimentary" should be -- complementary --

Signed and Sealed this

First Day of October, 2002

*Attest:*

*Attesting Officer*

JAMES E. ROGAN
*Director of the United States Patent and Trademark Office*